United States Patent
Kim et al.

(10) Patent No.: US 10,879,213 B2
(45) Date of Patent: Dec. 29, 2020

(54) DISPLAY APPARATUS AND MULTI SCREEN DISPLAY APPARATUS COMPRISING THE SAME

(71) Applicant: LG Display Co., Ltd., Seoul (KR)

(72) Inventors: MinSeok Kim, Osan-si (KR); JiHun Song, Paju-si (KR); YounYeol Yu, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 69 days.

(21) Appl. No.: 16/045,070

(22) Filed: Jul. 25, 2018

(65) Prior Publication Data

US 2019/0035765 A1 Jan. 31, 2019

(30) Foreign Application Priority Data

Jul. 31, 2017 (KR) .................. 10-2017-0097337

(51) Int. Cl.
*H01L 25/04* (2014.01)
*H01L 23/498* (2006.01)
(Continued)

(52) U.S. Cl.
CPC ............ *H01L 25/048* (2013.01); *H01L 23/26* (2013.01); *H01L 23/4985* (2013.01);
(Continued)

(58) Field of Classification Search
CPC ........ B32B 2307/412; B32B 2307/728; B32B 2457/20; B32B 3/04; B32B 15/08; B32B 15/18; B32B 2255/10; B32B 2255/20; B32B 2255/28; B32B 2307/402; B32B 2307/41; B32B 2307/416; B32B 2307/42; B32B 2307/546; B32B 2307/7244; B32B 2307/7246; B32B 27/08; B32B 27/281; B32B 27/36; B32B 3/02; B32B 3/08; B32B 3/30; B32B 7/06; B32B 7/12; G09G 2300/026; G09G 2380/02; G09G 3/32; H01L 2251/5338; H01L 2251/5369; H01L 23/26; H01L 23/4985; H01L 25/048; H01L 25/0753; H01L 27/156; H01L 27/322; H01L 27/3244; H01L 27/3293;
(Continued)

(56) References Cited

U.S. PATENT DOCUMENTS 8,576,209 B2  11/2013  Miyaguchi
8,593,061 B2  11/2013  Yamada
(Continued)

FOREIGN PATENT DOCUMENTS

KR  10-2016-0149385 A  12/2016

*Primary Examiner* — Mark W Tornow
*Assistant Examiner* — Priya M Rampersaud
(74) *Attorney, Agent, or Firm* — Seed Intellectual Property Law Group LLP

(57) ABSTRACT

Disclosed is a display apparatus having a minimum bezel area and a multi-screen display apparatus comprising the same, wherein the display apparatus may include a first substrate having an active area, a non-active area surrounding the active area, and a bending portion bent in a curved shape, a display portion disposed on the active area of the first substrate, a protection layer for covering the display portion, and a second substrate disposed on the protection layer and configured to have a smaller size than the active area.

20 Claims, 9 Drawing Sheets

(51) Int. Cl.

| | |
|---|---|
| *H01L 23/26* | (2006.01) |
| *H01L 33/44* | (2010.01) |
| *H01L 33/50* | (2010.01) |
| *H01L 27/15* | (2006.01) |
| *H01L 51/00* | (2006.01) |
| *H01L 51/52* | (2006.01) |
| *H01L 27/32* | (2006.01) |
| *G09G 3/32* | (2016.01) |
| *H01L 25/075* | (2006.01) |
| *B32B 3/04* | (2006.01) |

(52) U.S. Cl.
CPC ........ *H01L 27/156* (2013.01); *H01L 27/3244* (2013.01); *H01L 27/3293* (2013.01); *H01L 33/44* (2013.01); *H01L 33/502* (2013.01); *H01L 51/0097* (2013.01); *H01L 51/5237* (2013.01); *H01L 51/5253* (2013.01); *B32B 3/04* (2013.01); *B32B 2307/412* (2013.01); *B32B 2307/728* (2013.01); *B32B 2457/20* (2013.01); *G09G 3/32* (2013.01); *G09G 2300/026* (2013.01); *G09G 2380/02* (2013.01); *H01L 25/0753* (2013.01); *H01L 27/322* (2013.01); *H01L 51/524* (2013.01); *H01L 51/5243* (2013.01); *H01L 51/5259* (2013.01); *H01L 2251/5338* (2013.01); *H01L 2251/5369* (2013.01); *H01L 2933/0083* (2013.01)

(58) Field of Classification Search
CPC ............. H01L 2933/0083; H01L 33/44; H01L 33/502; H01L 51/0097; H01L 51/5237; H01L 51/524; H01L 51/5243; H01L 51/5253; H01L 51/5259
See application file for complete search history.

(56) References Cited

U.S. PATENT DOCUMENTS

| | | | |
|---|---|---|---|
| 2010/0065832 A1* | 3/2010 | Sugimoto | ........... H01L 27/3293 257/40 |
| 2014/0211144 A1* | 7/2014 | Shinohara | ............. G02F 1/1339 349/153 |
| 2016/0181346 A1* | 6/2016 | Kwon | ................... H01L 27/124 257/40 |
| 2016/0374191 A1 | 12/2016 | Kim et al. | |
| 2018/0027673 A1* | 1/2018 | Andou | .................... H01L 51/56 361/749 |
| 2019/0033652 A1* | 1/2019 | Sano | ................. G02F 1/133308 |

* cited by examiner

DISPLAY APPARATUS AND MULTI SCREEN DISPLAY APPARATUS COMPRISING THE SAME

CROSS REFERENCE TO RELATED APPLICATIONS

This application claims the benefit of the Korean Patent Application No. 10-2017-0097337 filed on Jul. 31, 2017, which is hereby incorporated by reference as if fully set forth herein.

BACKGROUND

Technical Field

Embodiments of the present disclosure relate to a display apparatus and a multi-screen display apparatus comprising the same.

Description of the Related Art

With the advancement of an information-oriented society, a display apparatus for displaying information in bulk has been developed rapidly. Recently, a liquid crystal display (LCD) device or organic light emitting display (OLED) device, which corresponds to a flat display apparatus having advantages of thin profile, lightness in weight, and low power consumption, has been widely utilized.

A related art display apparatus includes an active area (or display area), and a non-active area (or non-display area) prepared in the periphery of the active area. The related art display apparatus includes a bezel area corresponding to the non-active area.

Recently, a multi-screen display apparatus capable of realizing a large-sized display screen by arranging a plurality of screen apparatuses having display apparatuses in a lattice pattern has been utilized.

However, the related art multi-screen display apparatus has a boundary area corresponding to a seam between the display apparatuses connected with each other due to the bezel area in the plurality of display apparatuses. If one image is displayed on an entire screen, a sense of immersion may be lowered due to a disconnection caused by the boundary area.

BRIEF SUMMARY

Accordingly, embodiments of the present disclosure are directed to a display apparatus that substantially obviates one or more problems due to limitations and disadvantages of the related art, and a multi-screen display apparatus comprising the same.

An aspect of embodiments of the present disclosure is directed to provide a display apparatus with a minimum bezel area, and a multi-screen display apparatus comprising the same.

Another aspect of embodiments of the present disclosure is directed to provide a multi-screen display apparatus capable of removing or minimizing a boundary line between display apparatuses.

Additional advantages and features of embodiments of the disclosure will be set forth in part in the description which follows and in part will become apparent to those having ordinary skill in the art upon examination of the following or may be learned from practice of embodiments of the disclosure. The objectives and other advantages of embodiments of the disclosure may be realized and attained by the structure particularly pointed out in the written description and claims hereof as well as the appended drawings.

To achieve these and other advantages and in accordance with the purpose of embodiments of the disclosure, as embodied and broadly described herein, there is provided a display apparatus that may include a first substrate having an active area, a non-active area surrounding the active area, and a bending portion having a curved shape (or curved-surface shape), a display portion disposed on the active area of the first substrate, a protection layer covering the display portion, and a second substrate disposed on the protection layer, the second substrate having a smaller size than the active area.

In some embodiments, the second substrate includes a first surface which is adjacent to the protection layer, and a second surface which is opposite to the first surface, and the bending portion of the first substrate is bent toward the second surface of the second substrate so as to surround a lateral side of the second substrate.

In some embodiments, the display apparatus further includes a fixing member prepared between the lateral side of the second substrate and the bending portion of the first substrate, and the fixing member includes a moisture absorbing material.

In another aspect of the embodiments of the present disclosure, there is provided a multi-screen display apparatus comprising a plurality of screen modules which are closely contacted to each other while being parallel to each other, wherein each of the plurality of screen modules includes the display apparatus that may include a first substrate having an active area, a non-active area surrounding the active area, and a bending portion bent in a curved shape, a display portion disposed on the active area of the first substrate, a protection layer for covering the display portion, and a second substrate disposed on the protection layer and configured to have a smaller size than the active area, and bending portions of the adjacent display apparatuses are in contact with each other.

It is to be understood that both the foregoing general description and the following detailed description of embodiments of the present disclosure are exemplary and explanatory and are intended to provide further explanation of the disclosure as claimed.

BRIEF DESCRIPTION OF THE SEVERAL VIEWS OF THE DRAWINGS

The accompanying drawings, which are included to provide a further understanding of embodiments of the disclosure and are incorporated in and constitute a part of this application, illustrate embodiment(s) of the disclosure and together with the description serve to explain the principle of embodiments of the disclosure. In the drawings.

DETAILED DESCRIPTION

Figure 1:
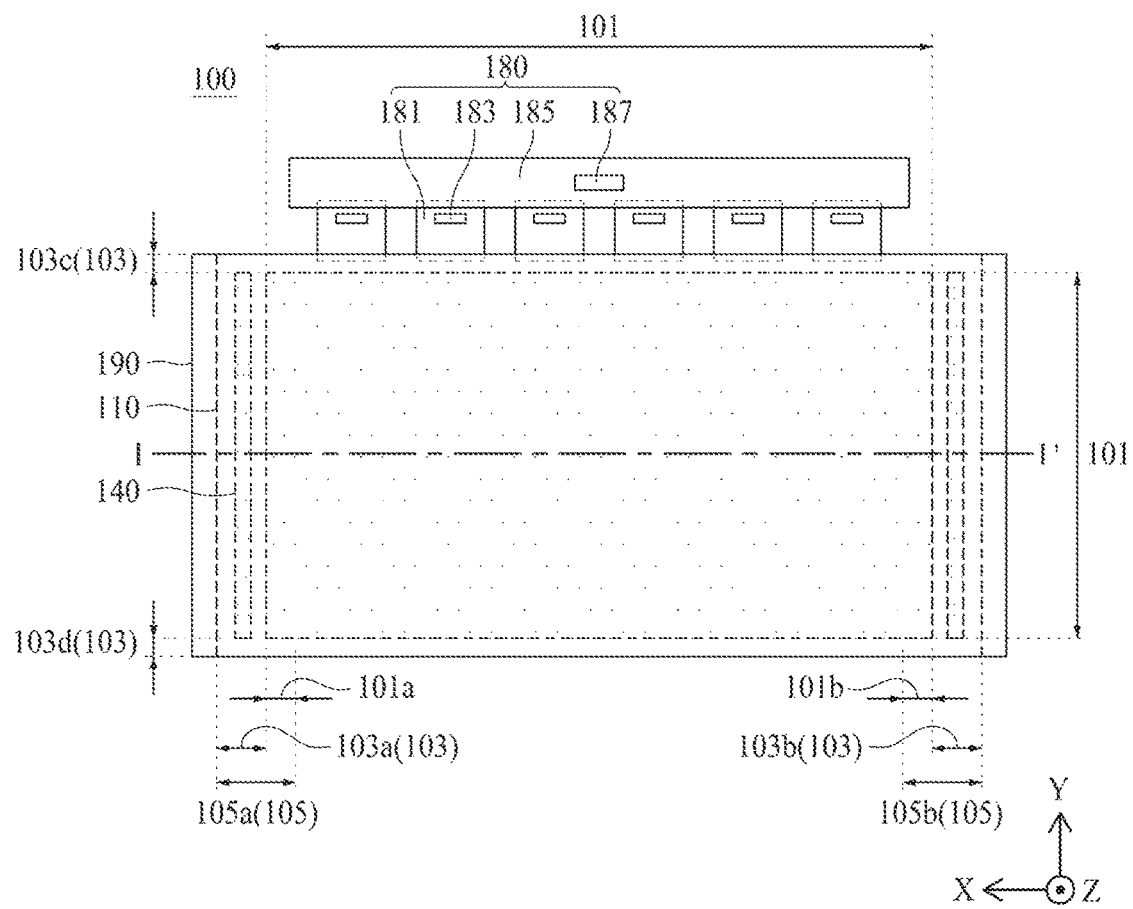
FIG. 1 is a plane view illustrating an unbent state of a display apparatus according to one or more embodiments of the present disclosure.

Reference will now be made in detail to the exemplary embodiments of the present disclosure, examples of which are illustrated in the accompanying drawings. Wherever possible or convenient for description of embodiments provided herein, the same reference numbers will be used throughout the drawings to refer to the same or like parts. Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In a case where 'comprise', 'have', and 'include' described in the present disclosure are used, another part may be added unless 'only~' is used. The terms of a singular form may include plural forms unless referred to the contrary.

In construing an element, the element is to be construed as including an error region although there is no explicit description.

In describing a positional relationship between elements, for example, when the positional order is described as 'on~', 'above~', 'below~', and 'next~', a case in which the elements are not in contact with each other may be included unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

Also, "first horizontal axis direction", "second horizontal axis direction", and "vertical axis direction" are not limited to a perpendicular geometric configuration. That is, "first horizontal axis direction", "second horizontal axis direction", and "vertical axis direction" may include an applicable wide range of a functional configuration.

Also, it should be understood that the term "at least one" includes all combinations related with any one item. For example, "at least one among a first element, a second element and a third element" may include all combinations of two or more elements selected from the first, second and third elements as well as each element of the first, second and third elements. Also, if it is mentioned that a first element is positioned "on or above" a second element, it should be understood that the first and second elements may be brought into contact with each other, or a third element may be interposed between the first and second elements.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, a display apparatus according to the embodiment of the present disclosure will be described in detail with reference to the accompanying drawings.

Figure 2:
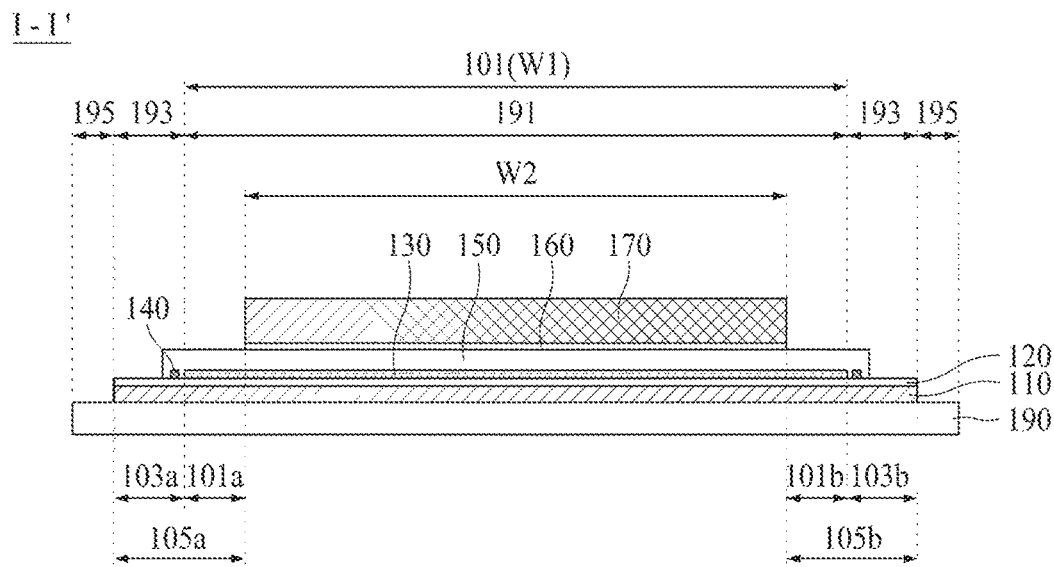
FIG. 2 is a cross sectional view along the line of FIG. 1.

FIG. 1 is a plane view illustrating an unbent state of a display apparatus according to one embodiment of the present disclosure. FIG. 2 is a cross sectional view along the line I-I' of FIG. 1.

Referring to FIGS. 1 and 2, the display apparatus 100 according to one embodiment of the present disclosure may include a first substrate 110, a display portion 130, a protection layer 150, and a second substrate 170.

The first substrate 110 is a base substrate, which is a flexible substrate. For example, the first substrate 110 may include a transparent polyimide material. The first substrate 110 of the transparent polyimide material may be obtained by curing polyimide resin coated at a predetermined thickness onto a front surface of a release layer prepared in a carrier glass substrate. The carrier glass substrate is separated from the first substrate 110 by the use of release of the release layer for a laser release process.

The first substrate 110 may include an active area 101, a non-active area 103, and a bent portion 105 (which may be referred to herein as a bending portion 105) having a curved shape.

The active area 101 is a display area for displaying an image, which may be defined in a central area of the first substrate 110.

The active area 101 may include an active bending area prepared in its edge. A width of the active bending area may be set based on the curvature radius of the bending portion 105. The active bending area may include a first active bending area 101a prepared in a first edge adjacent to a first non-active area 103a, and a second active bending area 101b prepared in a second edge adjacent to a second non-active area 103b.

The non-active area 103 is a non-display area on which an image is not displayed, which may be defined in an edge area of the first substrate 110 to surround the active area 101. The non-active area 103 may include first to fourth non-active regions 103a, 103b, 103c and 103d (which may be referred to herein as first to fourth non-active areas 103a, 103b, 103c and 103d). For example, with respect to a plane state (or flat state), the first non-active area 103a corresponds to a left-side non-active area of the first substrate 110, the second non-active area 103b corresponds to a right-side non-active area of the first substrate 110, the third non-active area 103c corresponds to an upper-side non-active area of the first substrate 110, and the fourth non-active area 103d corresponds to a lower-side non-active area of the first substrate 110.

The bending portion 105 may be defined as an area bent in a curved shape.

The bending portion 105 according to one embodiment of the present disclosure may include a first bending area 105a which is overlapped with the first non-active area 103a, and a second bending area 105b which is overlapped with the second non-active area 103b while being parallel to the first bending area 105a.

Each of the first bending area 105a and the second bending area 105b included in the bending portion 105 according to one embodiment of the present disclosure may include an active bending area and a non-active area. That is, the first bending area 105a may include a first active bending area 101a and a first non-active area 103a. The second bending area 105b may include a second active bending area 101b and a second non-active area 103b.

Each of the first active bending area 101a and the second active bending area 101b may be defined as an edge display area for displaying an image in a lateral side of the display apparatus. The remaining active area 101 except the first and second active bending areas 101a and 101b may be defined as a front display area.

A buffer film 120 may be formed on a first surface of the first substrate 110. In order to prevent moisture from being permeated into the active area 101 through the first substrate 110, the buffer film 120 may be formed on the entire first surface of the first substrate 110. According to one embodiment of the present disclosure, the buffer film 120 may be formed of a plurality of inorganic films deposited alternately. For example, the buffer film 120 may be formed in a multi-layered structure obtained by alternately depositing at least one inorganic film among silicon oxide film (SiOx), silicon nitride film (SiNx) and silicon nitride oxide film (SiON). It is possible to omit the buffer film 120.

The display portion 130 includes a pixel array layer disposed on the active area 101 of the first substrate 110. That is, the display portion 130 is formed on the buffer film 120 or the first surface of the first substrate 110 overlapped with the active area 101 defined in the first substrate 110.

The pixel array layer may include scan lines, data lines, driving power source lines, a pixel driving circuit, and an emission device layer.

The scan lines are disposed while being parallel to a first length direction (X) of the first substrate 110, and are separated each other along a second length direction (Y) of the first substrate 110.

The data lines are disposed while being parallel to the second length direction (Y) of the first substrate 110, are separated each other along a first length direction (X) of the first substrate 110.

The driving power source lines are disposed while being parallel to the data lines.

The pixel driving circuit is prepared in a pixel region defined by crossing the scan lines and data lines, wherein the pixel driving circuit may include at least two thin film transistors and at least one capacitor. The pixel driving circuit makes the emission device layer emit light in accordance with a scan signal supplied from the adjacent scan line, a driving power source supplied from the adjacent driving power source line, and a data signal supplied from the data line.

The emission device layer emits light in accordance with the data signal supplied from the pixel driving circuit of the corresponding pixel. The light emitted from the emission device layer is extracted in the external through the first substrate 110. The emission device layer may include a first electrode connected with the pixel driving circuit of the corresponding pixel, an emission layer formed on the first electrode, and a second electrode formed on the emission layer.

The first electrode may be an anode electrode patterned by each individual pixel. The first electrode may be formed of a transparent metal material capable of passing through light, for example, indium tin oxide (ITO) or indium zinc oxide (IZO).

The emission layer according to one embodiment of the present disclosure may include a red emission layer, a green emission layer, and a blue emission layer, each of which emits light corresponding to a color preset in the corresponding pixel.

The emission layer according to another embodiment of the present disclosure may be a common layer provided for the pixels in common. In this case, it is possible to simplify a manufacturing process. The emission layer may include any one among an organic emission layer, an inorganic emission layer, and a quantum dot emission layer, or may include a deposition or mixing structure of the organic emission layer (or inorganic emission layer) and the quantum dot emission layer. The emission layer includes two or more emission portions for emitting white light. For example, the emission layer may include first and second emission portions for emitting white light by mixture of first light and second light. Herein, the first emission portion may emit the first light, and the first emission portion may include any one among blue, green, red, yellow, and yellowish green emission portions. The second emission portion may include an emission portion for emitting light which has a complementary color of the first color among the blue, green, red, yellow, and yellowish green.

If the emission layer is formed of the common layer, the display portion 130 includes a wavelength conversion layer prepared between the first substrate 110 and the emission device layer. The wavelength conversion layer according to one embodiment of the present disclosure includes a color filter which transmits only wavelength of the color preset in the corresponding pixel from white light which is provided from the emission device layer of each pixel. For example, the wavelength conversion layer may transmit only wavelength of the red, green or blue color.

The wavelength conversion layer according to another embodiment of the present disclosure may include a quantum dot having a size which re-emits light in accordance with the white light which is provided from the emission device layer of each pixel, and emits light having the color preset in the pixel. Herein, the quantum dot may be selected among Cds, CdSe, CdTe, ZnS, ZnSe, GaAs, GaP, GaAs—P, Ga—Sb, InAs, InP, InSb, AlAs, AlP and AlSb. For example, the quantum dot of CdSe or InP may emit red light, the quantum dot of CdZnSeS may emit green light, and the quantum dot of ZnSe may emit blue light. If the wavelength conversion layer includes the quantum dot, it is possible to realize high color resolution ratio.

The wavelength conversion layer according to another embodiment of the present disclosure may include a color filter containing a quantum dot.

The second electrode, which corresponds to a cathode electrode, may be a common layer provided for the pixels in common. The second electrode may include a metal material with high reflectance. For example, the second electrode may be formed in a multi-layered structure, for example, a deposition structure of aluminum and titanium (Ti/Al/Ti), a deposition structure of aluminum and Indium Tin Oxide (ITO/Al/ITO), an APC alloy, and a deposition structure of APC alloy and Indium Tin Oxide (ITO/APC/ITO), or may be formed in a single-layered structure of any one material or an alloy material of two or more materials selected among argentums (Ag), aluminum (Al), molybdenum (Mo), aurum (Au), magnesium (Mg), calcium (Ca) and barium (Ba).

The pixels according to one embodiment of the present disclosure may be formed in a stripe structure on the active area 101. In this case, one unit pixel may include red, green and blue pixels, and may further include a white pixel.

The pixels according to another embodiment of the present disclosure may be formed in a pentile structure on the active area 101. In this case, one unit pixel may include one red pixel, two green pixels and one blue pixel disposed in a polygonal shape on the plane. For example, in case of the pixels having the pentile structure, one red pixel, the two green pixels and one blue pixel may be disposed to have an octagonal shape on the plane. In this case, the blue pixel has the largest size, and the green pixel has the smallest size.

The protection layer 150 is formed to surround the display portion 130. The protection layer 150 prevents moisture or oxygen from being permeated into the emission device layer. The protection layer 150 according to one embodiment of the present disclosure may include at least one inorganic film. The inorganic film may be formed of silicon nitride, aluminum nitride, zirconium nitride, titanium nitride, hafnium nitride, tantalum nitride, silicon oxide, aluminum oxide, or titanium oxide. Selectively, the protection layer 150 may further include at least one organic film. The organic film may be formed at a thickness sufficient for preventing particles from being permeated into the emission device layer through the protection layer 150. The protection layer 150 may be expressed as an encapsulation layer.

The second substrate 170 is disposed on the protection layer 150. The second substrate 170 may include a first surface close to the protection layer 150, and a second substrate which is opposite to the first surface. The first surface of the second substrate 170 may be attached to the protection layer 150. The first substrate 170 firstly prevents moisture or oxygen from being permeated into the emission device layer.

The second substrate 170 according to one embodiment of the present disclosure may be formed of an opaque metal material, for example, metal foil, metal sheet or metal plate. For example, the second substrate 170 may be formed of an alloy material of nickel (Ni) and iron (Fe) having a low thermal expansion coefficient, but not limited to this material.

The second substrate 170 according to the present disclosure has a relatively small size in comparison to the active area 101 defined in the first substrate 110 so as to facilitate the bending of the bending portion 105. To this end, the second substrate 170 may have a second width (W2) which is smaller than a first width (W1) of the active area 101 with respect to the first direction (X), and the second substrate 170 may have the same width as the width of the active area 101 with respect to the second direction (Y). Accordingly, the second substrate 170 has a size overlapped with the remaining active area 101 except the active bending areas 101a and 101b defined in the first substrate 110 so that the second substrate 170 is not overlapped with the bending portion 105 defined in the first substrate 110.

The first surface of the second substrate 170 is attached to the protection layer 150 by the use of adhesive layer 160. The adhesive layer 160 may be a thermal curing type adhesive or natural curing type adhesive. For example, the adhesive layer 160 may be formed of a pressure-sensitive adhesive or a barrier pressure-sensitive adhesive having a moisture absorbing function.

Additionally, the display apparatus according to the present disclosure may further include a scan driving circuit 150 and a display driving circuit portion 180.

The scan driving circuit 140 is prepared in the non-active area 103 of the first substrate 110. The scan driving circuit 140 generates a scan signal in accordance with a scan control signal supplied from the display driving circuit portion 180, and supplies the scan signal to the corresponding scan line in accordance with a preset order. The scan driving circuit 140 according to one embodiment of the present disclosure may be provided in the non-active area 103 of the first substrate 110 together with the thin film transistor. For example, the scan driving circuit 140 may be disposed in at least one area of the first non-active area 103a and the second non-active area 103b of the first substrate 110.

The display driving circuit portion 180 is connected with a pad portion prepared in the third non-active area 103c of the first substrate 110, and the display driving circuit portion 180 displays an image corresponding to video data supplied from a display driving system in each pixel. The display driving circuit portion 180 according to one embodiment of the present disclosure may include a plurality of flexible circuit films 181, a plurality of data driving integrated circuits 183, a printed circuit board 185 and a timing controller 187.

An input terminal prepared at one side in each of the plurality of flexible circuit films 181 is attached to the printed circuit board 185 by a film attachment process, and an output terminal prepared at the other side in each of the plurality of flexible circuit films 181 is attached to the pad portion prepared in the first substrate 110 by the film attachment process. Each of the plurality of flexible circuit films 181 may be bent to surround a lateral side of the second substrate 170.

Each of the plurality of data driving integrated circuits 183 may be individually mounted on each of the plurality of flexible circuit films 181. Each of the plurality of data driving integrated circuits 183 receives pixel data and data control signal supplied from the timing controller 187, converts the pixel data into an analog type pixel data signal in accordance with the data control signal, and supplies the analog type pixel data signal to the corresponding data line. Each of the plurality of data driving integrated circuits 183 may be disposed on the second surface of the second substrate 170 or at the lateral side of the second substrate 170 in accordance with the bending of the corresponding flexible circuit film 181.

The printed circuit board 185 supports the timing controller 183, and transmits signal and power source in the elements of the display driving circuit portion 180. The printed circuit board 185 may be disposed on the second surface of the second substrate 170.

The timing controller 187 is mounted on the printed circuit board 185, and the timing controller 187 receives video data and timing synchronization signal provided from the display driving system through a user connector prepared in the printed circuit board 185. The timing controller 187 generates pixel data by properly aligning the video data in accordance with a pixel arrangement structure of the display portion 130 on the basis of timing synchronization signal, and provides the generated pixel data to the corresponding data driving integrated circuit 183. Also, the timing controller 187 generates data control signal and scan control signal based on the timing synchronization signal, controls the driving timing for each of the plurality of data driving integrated circuits 183 through the use of data control signal, and controls the driving timing of the scan driving circuit 140 through the use of scan control signal. Herein, the scan control signal may be supplied to the corresponding scan driving circuit 140 through the first and/or final flexible circuit film among the plurality of flexible circuit films 181, and the non-active area 103 of the first substrate 110.

Additionally, the display apparatus according to the present disclosure may further include a transmissive film 190 which is attached to the first substrate 110 while being overlapped with the bending portion 105 and the active area 101 of the first substrate 110.

According as the transmissive film 190 is attached to the second surface which is opposite to the first surface of the first substrate 110 by the use of transparent adhesive layer, the bending portion 105 is easily bent without damages on the bending portion 105, and the remaining portion except the bending portion 105 is maintained in a flat state. The transmissive film 190 according to one embodiment of the present disclosure may be formed of a flexible film. For example, the transmissive film 190 according to one embodiment of the present disclosure may be formed of at least one of a polyethylene terephthalate film, a reflection preventing film, a polarizing film and a transmittance controllable film. The transmissive film 190 may be attached to the second surface of the first substrate 110 separated from a carrier glass substrate. The transparent adhesive layer may be optically clear resin (OCR) or optically clear adhesive (OCA).

The transmissive film 190 may include a first area 191 which is overlapped with the active area 101 of the first substrate 110, a second area 193 which extends from the first area 191 and is overlapped with the bending portion 105 of the first substrate 110, and a third area 195 which extends from the second area 193.

The first area 191 of the transmissive film 190 supports the active area 101. In this case, a size of the first area 191 of the transmissive film 190 is the same as a size of the remaining active area 101 except the first and second active bending areas 101a and 101b of the active area 101.

The second area 193 of the transmissive film 190 supports the bending portion 105 of the first substrate 110, wherein a size of the second area 193 is the same as a size of the bending portion 105 of the first substrate 110.

The third area 195 of the transmissive film 190 corresponds to the area which is not overlapped with the first substrate 110, wherein the third area 195 of the transmissive film 190 extends from the second area 193 which is overlapped with each of the first and second bending areas 105a and 105b. The third area 195 of the transmissive film 190 is prepared so as to facilitate the bending of the bending portion 105 without any damage on the bending portion 105. That is, the bending portion 105 of the first substrate 110 may be bent in a curved shape by the use of bending jig of bending apparatus. If the bending jig clamps the bending portion 105 of the first substrate 110, the bending portion 105 of the first substrate 110 may be damaged. In order to prevent this problem, the third area 195 of the transmissive film 190 extends from the second area 193, and the third area 195 of the transmissive film 190 may be defined as a clamping area of the bending jig for the bending process of the bending portion 105.

Figure 3:
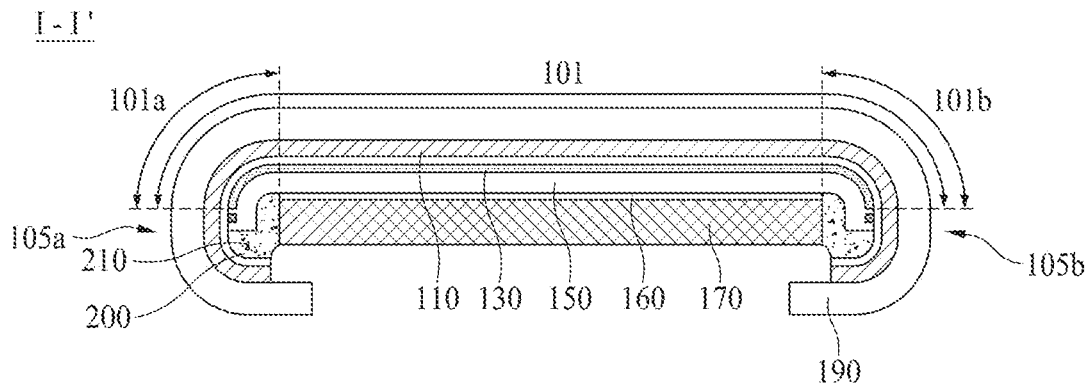
FIG. 3 is a cross sectional view illustrating a bending state of a bending portion shown in FIG. 1.

FIG. 3 is a cross sectional view illustrating the bending state of the bending portion shown in FIG. 1.

Referring to FIG. 3, in case of the display apparatus 100 according to the present disclosure, the bending portion 105 of the first substrate 110 is bent to have the curved shape. That is, each of the first and second bending areas 105a and 105b defined in the first substrate 110 is bent toward the second surface of the second substrate 170 so as to have a predetermined curvature radius, whereby the lateral side of the second substrate 170 is surrounded by each of the first and second bending areas 105a and 105b. In this case, each of the first and second bending areas 105a and 105b may be bent to have a curvature radius of 0.1 mm~3 mm.

According as each of the first and second bending areas 105a and 105b is bent to have the curved shape, each of the first and second active bending areas 101a and 101b of the active area 101 is also bent to have the curved shape. Thus, the display portion 130 overlapped with the first active bending area 101a bent in the curved shape forms a first edge display screen (or first sub display screen). In the same manner, the display portion 130 overlapped with the second active bending area 101b bent in the curved shape forms a second edge display screen (or second sub display screen). Meanwhile, the display portion 130 overlapped with the remaining active area 101 except the first and second active bending areas 101a and 101b forms a front display screen (or main display screen) having a virtually plane state.

According to the present disclosure, the second substrate 170 is not disposed on the area overlapped with the bending portion 105 defined in the first substrate 110, whereby each of the first bending area 105a and the second bending area 10b may be bent without a bending stress. Especially, if the bending portion 105 is bent in the curved shape, a tensile stress is applied to a protruding portion, and a compressive stress is applied to a hollow portion. In this case, a neutral plane, to which both the tensile stress and the compressive stress are not applied, remains in the bending portion 105 of the curved shape. The pixel array layer remains in at least one of the first bending area 105a and the second bending area 105b. If the neutral plane of the bending portion 105 does not remain in the pixel array layer, the thin film transistor and/or emission device layer formed in the pixel array layer may be damaged by the tensile stress or compressive stress. According as the second substrate 170 is not disposed on the area overlapped with the bending portion 105 defined in the first substrate 110, the neutral plane of the bending portion 105 is positioned between the thin film transistor and the emission device layer so that it is possible to prevent or minimize the thin film transistor and/or emission device layer from being damaged by the tensile stress or compressive stress generated in the bending portion 105 bent in the curved shape.

Additionally, the display apparatus 100 according to the present disclosure further includes a fixing member 200 for maintaining the bending state of the bending portion 105 which is bent in the curved shape.

The fixing member 200 is prepared between the lateral side of the second substrate 170 and the bending portion 105 of the first substrate 110 which is bent. As shown in FIG. 2, the fixing member 200 is coated onto the bending portion 105 while being disposed to include step difference portions among the buffer film 120, the protection layer 150, the adhesive layer 160 and the second substrate 170 on the virtual plane shape of the bending portion 105, and is then cured after bending the bending portion 105 so that it is possible to maintain the bending shape of the bending portion 105 bent in the curved shape.

The fixing member 200 according to the embodiment of the present disclosure may be formed of a pressure-sensitive adhesive or a barrier pressure-sensitive adhesive having a moisture absorbing function. The fixing member 200 may include a moisture absorbent 210, which may be dispersed throughout the fixing member 200. For example, the barrier pressure-sensitive adhesive includes a moisture absorbent 210 for the moisture absorbing function. Herein, the moisture absorbent 210 absorbs the moisture or oxygen which permeates into the inside of the fixing member 200 through a chemical reaction so that the moisture absorbent 210 serves a lateral moisture-permeation preventing function for protecting the emission device layer from the moisture or oxygen. For example, the moisture absorbent 210 may be formed of metal oxide or metal powder such as alumina.

Meanwhile, the emission device layer of the display portion 130 may be damaged by the moisture which permeates through the boundary lines among the buffer film 120, the protection layer 150, the adhesive layer 160 and the second substrates 170 on the bending portion 105 of the first substrate 110. In this reason, the fixing member 200 is formed of the barrier pressure-sensitive adhesive including the moisture absorbent 210 so as to prevent the lateral moisture permeation, preferably. The fixing member 200 including the moisture absorbent 210 may be expressed as a side barrier sealing member.

In case of the display apparatus 100 according to the present disclosure, the second substrate 170 is smaller than the active area 101 defined in the first substrate 110 so that it facilitates the bending of the bending portion 105, and it enables a bezel width of 10 µm or less than 10 µm in accordance with the bending of the bending portion 105. In the display apparatus 100 according to the present disclosure, the second substrate 170 is not disposed on the bending portion 105, whereby it is possible to prevent the thin film transistor and/or emission device layer provided on the bending portion 105 from being damaged for the process of bending the bending portion 105. Especially, in case of the display apparatus 100 according to the present disclosure, the bending portion 105 of the first substrate 110 is bent toward the second substrate 170 in accordance with an upper bending method, and is fixed by the use of fixing member 200 including the moisture absorbent 210, whereby it has the relatively small bezel width in comparison to that of a lower bending method which is opposite to the upper bending method, and it also enables the more-enhanced lateral moisture permeating prevention.

Figure 4:
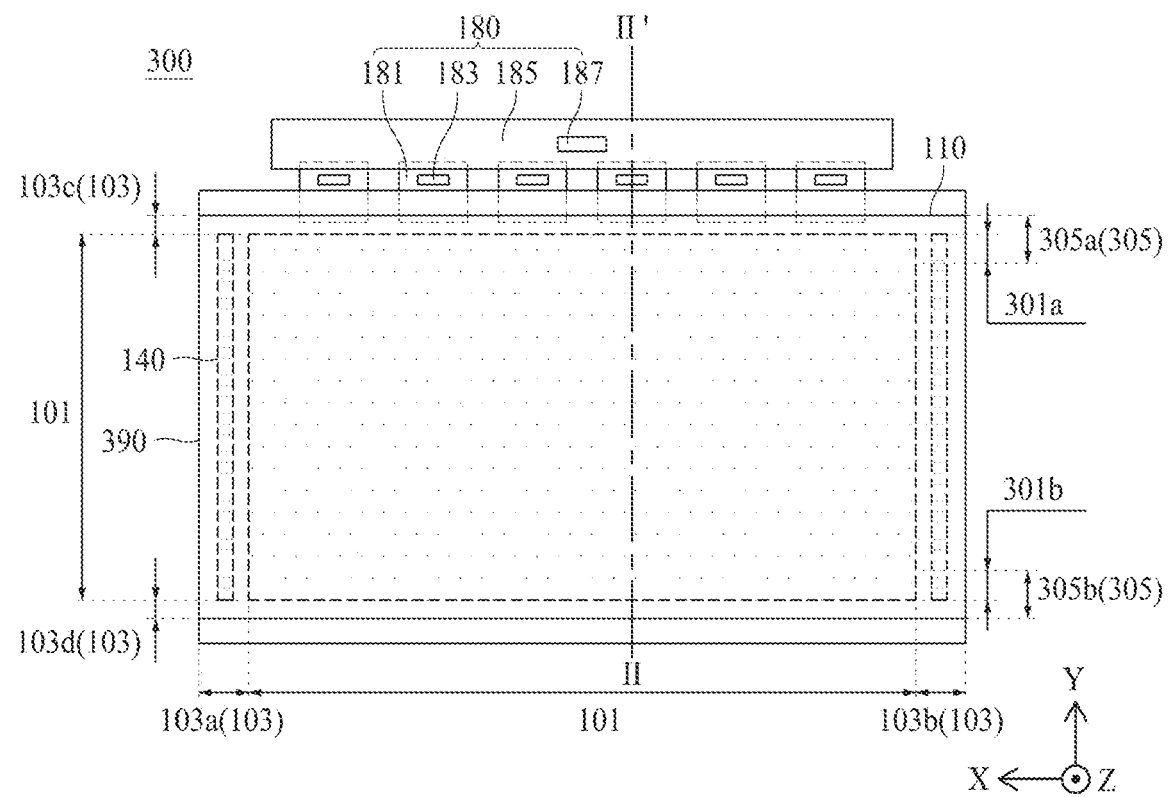
FIG. 4 is a plane view illustrating an unbent state of a display apparatus according to one or more embodiments of the present disclosure.
Figure 5:
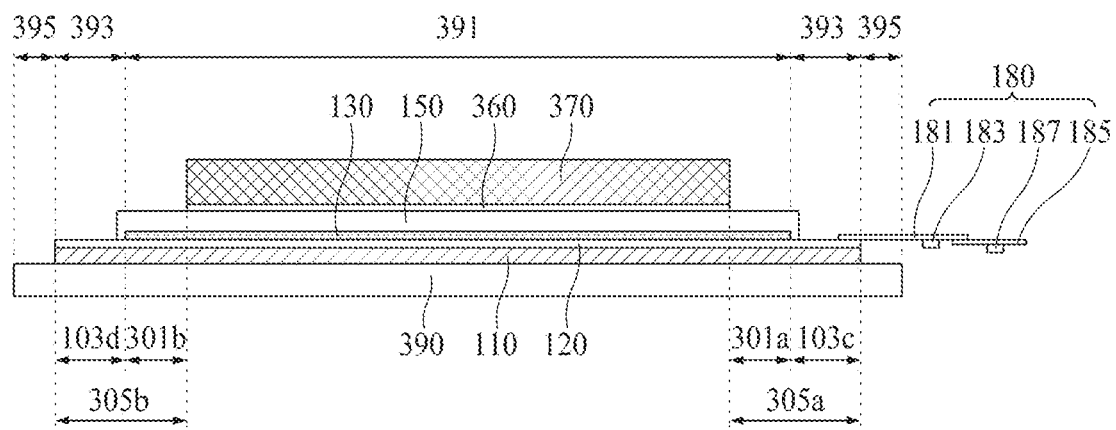
FIG. 5 is a cross sectional view along the line II-IF of FIG. 4.
Figure 6:
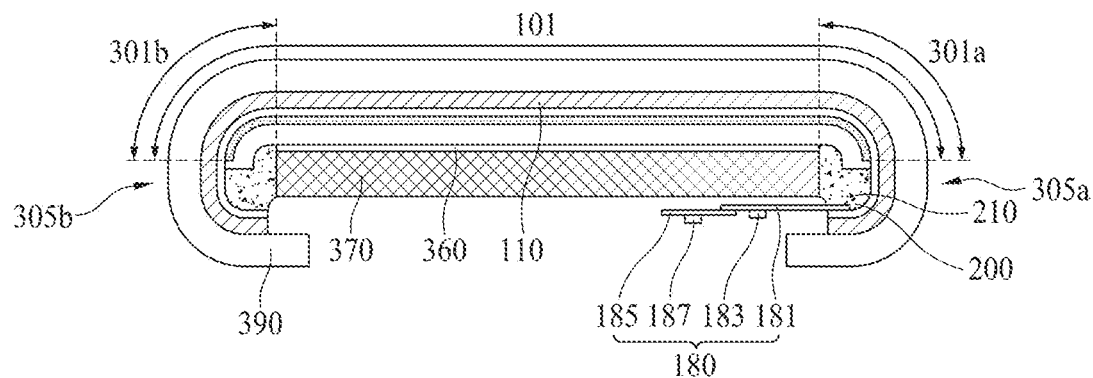
FIG. 6 is a cross sectional view illustrating a bending state of a bending portion shown in FIG. 4.

FIG. 4 is a plane view illustrating an unbent state of a display apparatus according to one embodiment of the present disclosure, FIG. 5 is a cross sectional view along II-II' of FIG. 4, and FIG. 6 is a cross sectional view illustrating a bending state of a bending portion shown in FIG. 4, which are obtained by changing the position of the bending portion in the display apparatus shown in FIGS. 1 to 3. That is, with respect to a plane state, upper and lower edge portions of the display apparatus are bent in a curved shape. Hereinafter, only the bending portion and related structures will be described in detail, the same reference numbers will be used throughout the drawings to refer to the same parts, and a detailed description for the same parts will be omitted.

Referring to FIGS. 4 to 6, in a display apparatus 300 according to the embodiment of the present disclosure, a bending portion 305 defined in a first substrate 110 may include a first bending area 305a which is overlapped with a third non-active area 103c, and a second bending area 305b which is overlapped with a fourth non-active area 103d while being parallel to the first bending area 305a. In this embodiment of the present disclosure, the first bending area 305a may be expressed as a third bending area, and the second bending area 305b may be expressed as a fourth bending area.

In this embodiment of the present disclosure, an active area 101 defined in the first substrate 110 may include a first active bending area 301a prepared in a third edge close to the third non-active area 103c, and a second active bending area 301b prepared in a fourth edge close to the fourth non-active area 103d. In this case, the first bending area 305a of the bending portion 105 may include all of the first active bending area 301a and the third non-active area 103c. The second bending area 305b may include all of the second active bending area 301b and the fourth non-active area 103d. In this embodiment of the present disclosure, the first active bending area 301a may be expressed as a third active bending area, and the second active bending area 301b may be expressed as a fourth active bending area.

Each of the first active bending area 301a and the second active bending area 301b may be defined as an edge display area for displaying an image at a lateral side of the display apparatus 300. The remaining active area 101 except the first and second active bending areas 301a and 301b may be defined as a front display area.

In this embodiment of the present disclosure, a second substrate 370 has a relatively small size in comparison to the active area 101 defined in the first substrate 110 so as to facilitate the bending of the bending portion 305. To this end, the second substrate 370 may have a width which is smaller than a width of the active area 101 with respect to a first direction (X), and the second substrate 370 may have the same width as the width of the active area 101 with respect to a second direction (Y). Accordingly, the second substrate 370 has a size overlapped with the remaining active area 101 except the first and second active bending areas 301a and 301b defined in the first substrate 110 so that the second substrate 370 is not overlapped with the bending portion 305 defined in the first substrate 110. A first surface of the second substrate 370 is attached to a protection layer 150 by the use of adhesive layer 360. The adhesive layer 360 may be a thermal curing type adhesive or natural curing type adhesive. For example, the adhesive layer 360 may be formed of a pressure-sensitive adhesive or a barrier pressure-sensitive adhesive having a moisture absorbing function.

In this embodiment of the present disclosure, a transmissive film 390 is attached to a second surface, which is opposite to a first surface of the first substrate 110, by the use of transparent adhesive layer. The transmissive film 390 may include a first area 391 which is overlapped with the active area 101 of the first substrate 110, a second area 393 which extends from the first area 391 and is overlapped with the bending portion 305 of the first substrate 110, and a third area 395 which extends from the second area 393. Except that the third area 395 of the transmissive film 390 extends from the second area 393 which is overlapped with each of the first and second bending areas 305a and 305b of the first substrate 110, the transmissive film shown in FIGS. 4 to 6 may be the same as the transmissive film 190 shown in FIGS. 1 to 3. The third area 395 of the transmissive film 390 extends from the second area 393, which may be defined as a clamping area of a bending jig for the process of bending the bending portion 305.

In the display apparatus 300 according to the embodiment of the present disclosure, each of the first and second bending areas 305a and 305b defined in the first substrate 110 is bent toward the second surface of the second substrate 370 so as to have a predetermined curvature radius, and is provided to surround a lateral side of the second substrate 370. In this case, each of the first and second bending areas 305a and 305b may be bent to have a curvature radius of 0.1 mm to 3 mm.

The bending portion 305 of the first substrate 110, which is bent in the curved shape, is maintained in a bending shape by the use of fixing member 200. That is, the fixing member 200 is prepared between the lateral side of the second substrate 370 and the bending portion 305 of the first substrate 110, which is bent, so that the fixing member 200 maintains the bending shape of the bending portion 305 which is bent in the curved shape. As described above, the fixing member 200 is formed of the barrier pressure-sensitive adhesive including the moisture absorbent 210 so as to prevent the lateral moisture permeation, preferably.

In this embodiment of the present disclosure, additionally, a display driving circuit portion 180, which is connected with a pad portion of the third non-active area 103c of the first substrate 110, is disposed on the second surface of the second substrate 370 in accordance with the bending of the first bending area 305a. In this case, flexible circuit films 181 of the display driving circuit portion 180 may be attached to the fixing member 200.

In the display apparatus according to the present disclosure, each of the third non-active area 103c of the first substrate 110 having the pad portion connected with the display driving circuit portion 180, and the fourth non-active area 103d which is parallel to the third non-active area 103c is bent in the curved shape so that it is possible to realize a small bezel width and more-enhanced lateral moisture permeation preventing function.

Figure 7:
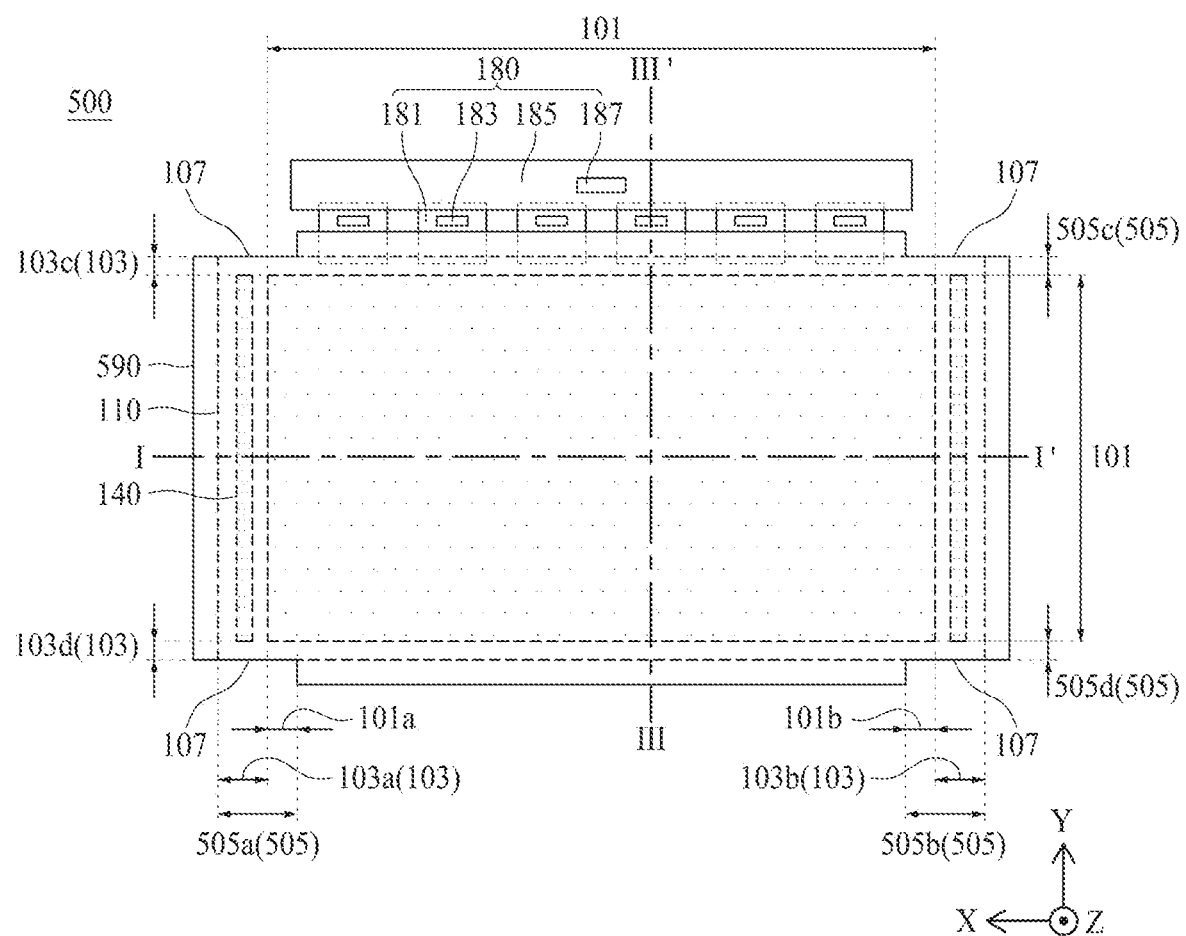
FIG. 7 is a plane view illustrating an unbent state of a display apparatus according to one or more embodiments of the present disclosure.
Figure 8:
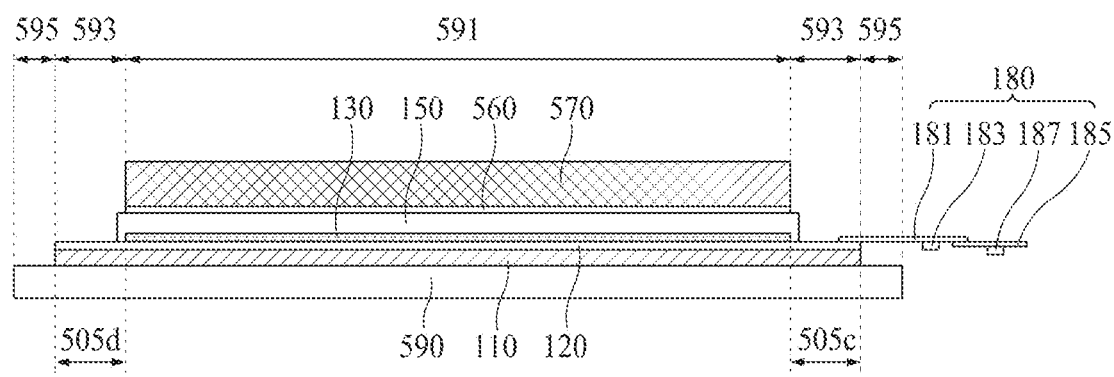
FIG. 8 is a cross sectional view along the line of FIG. 7.
Figure 9:
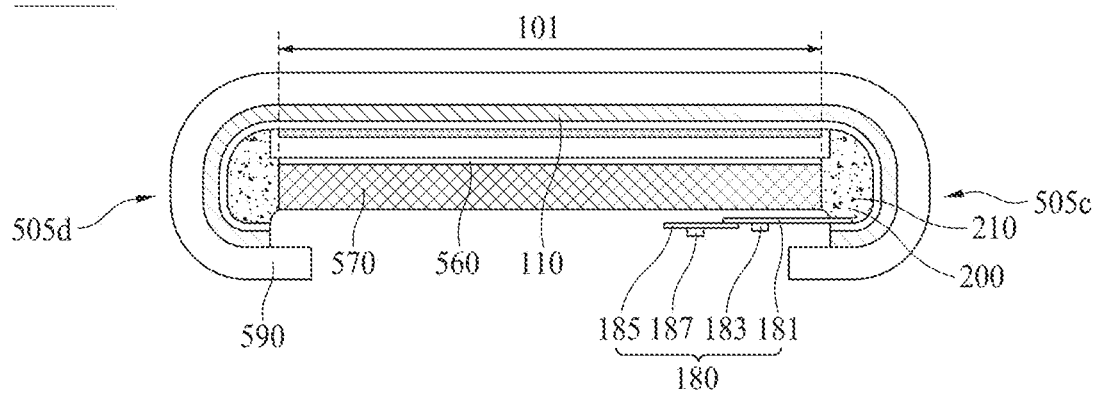
FIG. 9 is a cross sectional view illustrating a bending state of a bending portion shown in FIG. 7.

FIG. 7 is a plane view illustrating an unbent state of a display apparatus according to one embodiment of the present disclosure, FIG. 8 is a cross sectional view along of FIG. 7, and FIG. 9 is a cross sectional view illustrating a bending state of a bending portion shown in FIG. 7, which are obtained by providing a four-side bending structure of a bending portion in the display apparatus 100 and 300 shown in FIGS. 1 to 6. Hereinafter, only the bending portion and related structures will be described in detail, and the same reference numbers will be used throughout the drawings to refer to the same parts, and a detailed description for the same parts will be omitted.

Referring to FIGS. 7 to 9 in connection with FIG. 2, in case of a display apparatus 500 according to the embodiment of the present disclosure, a bending portion 505 defined in a first substrate 110 includes first to fourth bending areas 505a, 505b, 505c and 505d.

The first bending area 505a is overlapped with a first non-active area 103a of the first substrate 110, and the second bending area 505b is overlapped with a second non-active area 103b of the first substrate 110. The third bending area 505c is overlapped with a third non-active area 103c of the first substrate 110, and the fourth bending area 505d is overlapped with a fourth non-active area 103d of the first substrate 110.

In this embodiment of the present disclosure, an active area 101 defined in the first substrate 110 may include a first active bending area 101a prepared in a first edge close to the first non-active area 103a, and a second active bending area 101b prepared in a second edge close to the second non-active area 103b. In this case, the first bending area 505a may include both the first active bending area 101a and the first non-active area 103a. The second bending area 505b may include both the second non-active area 103b and the second active bending area 101b of the first substrate 110. As a result, each of the first bending area 505a and the second bending area 505b is identical to each of the first bending area 105a and the second bending area 105b shown in FIGS. 1 to 3.

The third bending area 505c is not overlapped with a third edge of the active area 101 so as to facilitate the bending of the active bending area 101a and 101b included in each of the first bending area 505a and the second bending area 505b, and is overlapped with only the third non-active area 103c of the first substrate 110. In the same manner, the fourth bending area 505d is not overlapped with a fourth edge of the active area 101 so as to facilitate the bending of the active bending area 101a and 101b included in each of the first bending area 505a and the second bending area 505b, and is overlapped with only the fourth non-active area 103d of the first substrate 110.

According as the display apparatus according to the embodiment of the present disclosure has the four-side bending structure, the first substrate 110 includes a chamfer area 107 prepared in each corner so as to facilitate the individual bending of each of the first to fourth bending areas 505a, 505b, 505c and 505d.

The chamfer area 107 may be prepared by removing each corner of the first substrate 110 in a rectangular shape by a substrate scribing process. In this case, the chamfer areas 107 prepared in both edges of the third non-active area 103c overlapped with the first and second non-active areas 103a and 103b of the first substrate 110 may be formed within a range capable of preventing a disconnection of a scan control signal line connected between a pad portion and a scan driving circuit 140.

In this embodiment of the present disclosure, a second substrate 570 may be smaller than the active area 101 defined in the first substrate 110. The second substrate 570 according to one embodiment of the present disclosure may have a size overlapped with the remaining active area 101 except the first and second active bending areas 101a and 101b defined in the first substrate 110. That is, the second substrate 570 is not overlapped with the bending portion 505 defined in the first substrate 110. A first surface of the second substrate 570 is attached to a protection layer 150 by the use of adhesive layer 560. The adhesive layer 560 may be a thermal curing type adhesive or natural curing type adhesive. For example, the adhesive layer 560 may be formed of a pressure-sensitive adhesive or a barrier pressure-sensitive adhesive having a moisture absorbing function.

In this embodiment of the present disclosure, a transmissive film 590 is attached to a second surface which is opposite to a first surface of the first substrate 110 by the use of transparent adhesive layer. The transmissive film 590 includes a first area 591 which is overlapped with the active area 101 of the first substrate 110, a second area 593 which extends from the first area 591 and is overlapped with the bending portion 505 of the first substrate 110, and a third area 595 which extends from the second area 593. Also, the transmissive film 590 includes a chamfer area which is overlapped with the chamfer area 107 prepared in each corner of the first substrate 110. Except that the third area 595 of the transmissive film 590 extends from the second area 593 overlapped with each of the first to fourth bending areas 505a, 505b, 505c and 505d, the third area 595 may be identical in structure to the transmissive film 190 shown in FIGS. 1 to 3. The third area 595 of the transmissive film 590 extends from the second area 593, which may be defined as a clamping area of a bending jig for a process of bending the bending portion 505.

In the display apparatus 500 according to the embodiment of the present disclosure, each of the first to fourth bending areas 505a, 505b, 505c and 505d defined in the first substrate 110 is bent toward the second surface of the second substrate 570 so as to have a predetermined curvature radius, as shown in FIGS. 3 and 9, whereby the lateral side of the second substrate 570 is surrounded by each of the first to fourth bending areas 505a, 505b, 505c and 505d. In this case, each of the first to fourth bending areas 505a, 505b, 505c and 505d may be bent to have a curvature radius of 0.1 mm-3 mm.

Each of the first to fourth bending areas 505a, 505b, 505c and 505d bent in the curved shape is maintained in the bending shape by the use of fixing member 200. That is, the fixing member 200 is prepared between the lateral side of the second substrate 570 and the first to fourth bending areas 505a, 505b, 505c and 505d of the first substrate 110, which is bent, so that the fixing member 200 maintains the bending shape of the first to fourth bending areas 505a, 505b, 505c and 505d bent in the curved shape. As described above, the fixing member 200 is formed of the barrier pressure-sensitive adhesive including the moisture absorbent 210 so as to prevent the lateral moisture permeation, preferably.

In this embodiment of the present disclosure, additionally, a display driving circuit portion 180, which is connected with a pad portion of the third non-active area 103c of the first substrate 110, is disposed on the second surface of the second substrate 570 in accordance with the bending of the third bending area 505c. In this case, flexible circuit films 181 of the display driving circuit portion 180 may be attached to the fixing member 200.

The display apparatus according to the present disclosure has the four-side bending structure in accordance with the additional bending structure in each of the third bending area 505c and the fourth bending area 505d so that it is possible to realize a small four-side bezel width, and also to obtain the same effects as those of the display apparatus shown in FIGS. 1 to 6.

Figure 10:
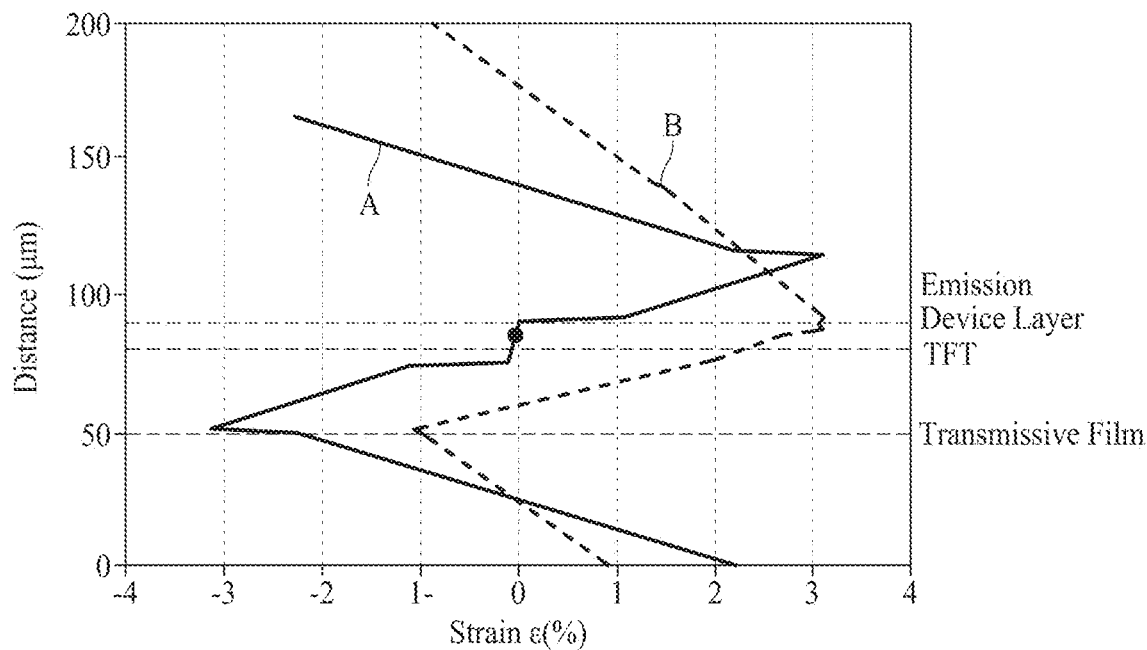
FIG. 10 illustrates simulation results obtained by comparing a strain value applied to a bending portion of a display apparatus according to an embodiment of the present disclosure with a strain value of a bending portion of a display apparatus according to a comparative example.

FIG. 10 illustrates simulation results obtained by comparing a strain value applied to a bending portion of a display apparatus according to one embodiment of the present disclosure with a strain value of a bending portion of a display apparatus according to a comparative example. For the simulation of the display apparatus according to one embodiment of the present disclosure, an active bending area which is not overlapped with a second substrate is bent to have a curvature radius of 3 mm, and a strain value in accordance with a distance from a transmissive substrate is measured. For the simulation of the display apparatus according to the comparative example, an active bending area which is overlapped with a second substrate is bent to have a curvature radius of 3 mm, and a strain value in accordance with a distance from a transmissive substrate is measured.

Referring to FIG. 10, a first graph (A) shows simulation results according to the embodiment of the present disclosure, and a second graph (B) shows simulation results according to the comparative example.

As shown in the first graph (A), the bending portion according to the present disclosure has the neutral plane (NP) formed between the emission device layer and the thin film transistor so that it is possible to prevent the thin film transistor and/or emission device layer formed in the bending portion from being damaged. Meanwhile, as shown in the second graph (B), in case of the bending portion according to the comparative example, a strain having a value of 3.2% is applied to the area between the emission device layer and the thin film transistor, whereby the thin film transistor and/or emission device layer formed in the bending portion may be damaged.

In case of the present disclosure, according as the second substrate 170 is not disposed on the area overlapped with the bending portion 105 defined in the first substrate 110, the neutral plane (NP) of the bending portion 105 is positioned between the thin film transistor and the emission device layer so that it is possible to minimize or prevent the thin film transistor and/or emission device layer from being damaged by the tensile stress or compressive stress applied to the bending portion 105 bent in the curved shape.

Figure 11:
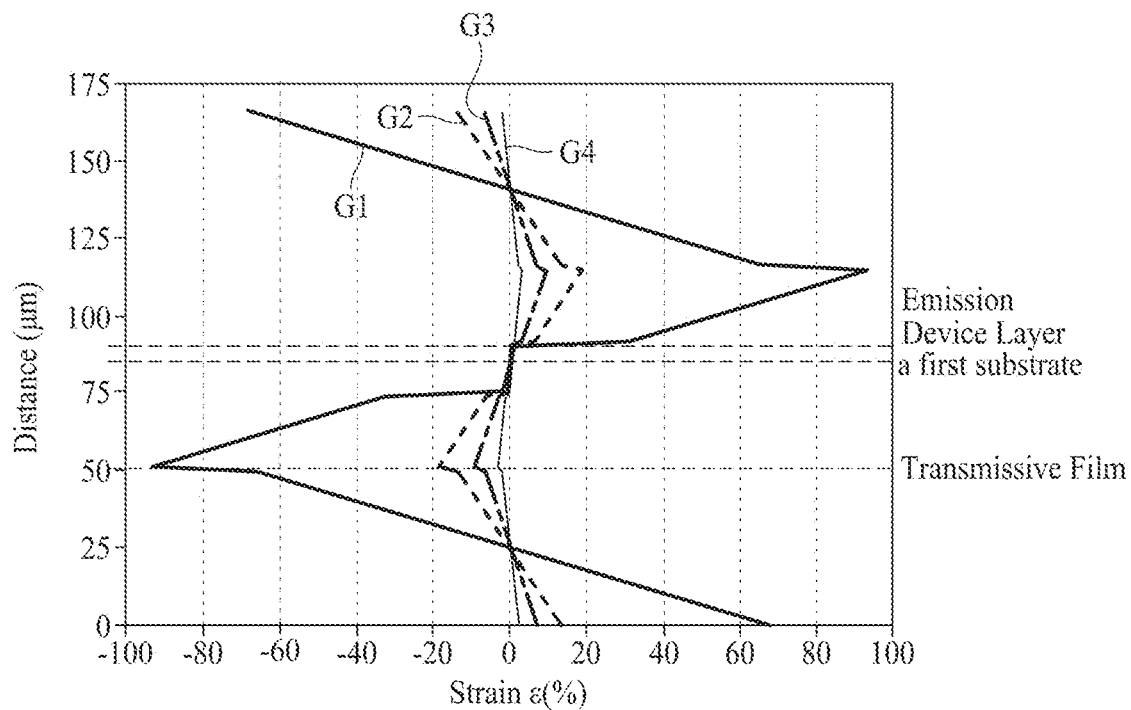
FIG. 11 illustrates simulation results obtained by measuring a strain value of a bending portion in accordance with a curvature radius in a display apparatus according to various embodiments of the present disclosure.

FIG. 11 illustrates simulation results obtained by measuring a strain value of a bending portion in accordance with a curvature radius in a display apparatus according to various embodiments of the present disclosure. In FIG. 11, a horizontal axis indicates a strain value, and a vertical axis indicates a distance from a transmissive substrate.

Referring to FIG. 11, a first graph (G1) shows simulation results for a bending portion according to the first embodiment having a curvature radius of 0.1 mm, a second graph (G2) shows simulation results for a bending portion according to the second embodiment having a curvature radius of 0.5 mm, a third graph (G3) shows simulation results for a bending portion according to the third embodiment having a curvature radius of 1 mm, and a fourth graph (G4) shows simulation results for a bending portion according to the fourth embodiment having a curvature radius of 3 mm.

As shown in each of the first to fourth graphs (G1, G2, G3, G4), it is checked that each of the first to fourth bending portions according to the present disclosure has the neutral plane (NP) between the emission device layer and the thin film transistor. Accordingly, the bending portion of the display apparatus may be bent to have the curvature radius of at least 0.1 mm without any damages on the thin film transistor and/or emission device layer. Especially, if the bending portion of the display apparatus is bent to have the curvature radius of 3 mm, it is possible to minimize the strain value applied to the vending portion.

Figure 12:
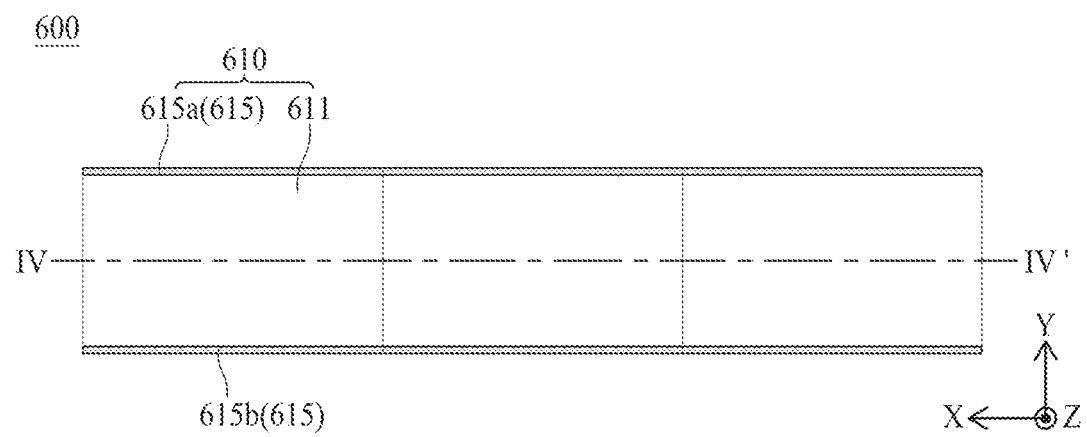
FIG. 12 is a plane view illustrating a multi-screen display apparatus according to one or more embodiments of the present disclosure.
Figure 13:
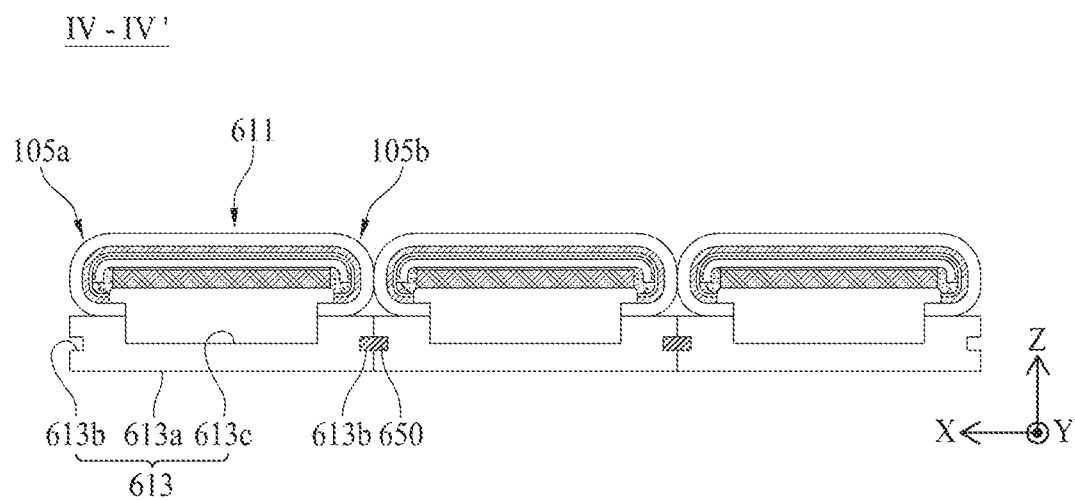
FIG. 13 is a cross sectional view along the line IV-IV' of FIG. 12.

FIG. 12 is a plane view illustrating a multi-screen display apparatus according to one embodiment of the present disclosure, and FIG. 13 is a cross sectional view along IV-IV' of FIG. 12, which show the multi-screen display apparatus using the display apparatus having the two-side (left and right sides) bending structure shown in FIG. 3.

Referring to FIGS. 12 and 13, a multi-screen display apparatus 600 according to one embodiment of the present disclosure includes a plurality of screen modules 610 which are closely contacted to each other while being parallel to each other.

Each of the plurality of screen modules 610 includes a display apparatus 611 and a support frame 613.

The display apparatus 611 includes a bending portion having first and second bending areas 105a and 105b which are parallel to each other. The display apparatus 611 is identical in structure to the display apparatus 100 shown in FIGS. 1 to 3, whereby a detailed description for the display apparatus 611 will be omitted.

The support frame 613 receives the display apparatus 611 therein. The support frame 613 according to one embodiment of the present disclosure includes a bottom surface 613a for supporting a rear surface of the display apparatus 611, a sidewall which is vertically prepared on the bottom surface 613a so as to surround the remaining lateral sides except the first and second bending areas 105a and 105b of the display apparatus 611, and at least one module connection portion 613b prepared in each of left and right lateral sides of the bottom surface 613a.

The bottom surface 613a may include a hollow portion 613c. The hollow portion 613c is provided while being hollowed from the bottom surface 613a, wherein the hollow portion 613c receives various circuits connected with a display driving circuit portion of the display apparatus 611.

The at least one module connection portion 613b may be connected with a module connection member 650 for closely connecting the plurality of screen modules 610 to each other. The at least one module connection portion 613b according to one embodiment of the present disclosure includes a groove having a predetermined depth from each of the left and right lateral sides of the bottom surface 613a. In this case, the module connection member 650 may be a connection pin which is inserted into the module connection portion 613b.

Each of the plurality of screen modules 610 may further include a front cover 615.

The front cover 615 covers the remaining non-active area except the first and second bending areas 105a and 105b of the display apparatus 611. The front cover 615 according to one embodiment of the present disclosure includes a first front cover 615a and a second front cover 615b.

The first front cover 615a is formed to have "⌐" shaped cross section and is connected with the support frame 613, to thereby cover the third non-active area of the display apparatus 611.

The second front cover 615b is formed to have "⌐" shaped cross section and is connected with the support frame 613, to thereby cover the fourth non-active area of the display apparatus 611.

Herein, respective lateral sides of the plurality of screen modules 610 are connected with each other in a first direction (X, or horizontal direction) through the use of module connection member 650. In this case, the bending portions (or edge display area) of the curved shape prepared in the adjacent display apparatuses 611 are in contact with each other without being covered by the sidewall of the support frame 613 so that it is possible to virtually remove a boundary portion corresponding to a seam between the adjacent display apparatuses 611.

In case of the multi-screen display apparatus according to the embodiment of the present disclosure, the bending portions of the curved shape prepared in the plurality of display apparatuses 611 are in contact with each other, and the respective lateral sides of the plurality of screen modules 610 are connected with each other so that it is possible to virtually remove the boundary portion between the adjacent display apparatuses 611. Thus, one image may be displayed without any disconnection in an entire screen, which enables to improve a sense of immersion for an image displayed on a large-sized screen, and to improve a size expandability.

Figure 14:
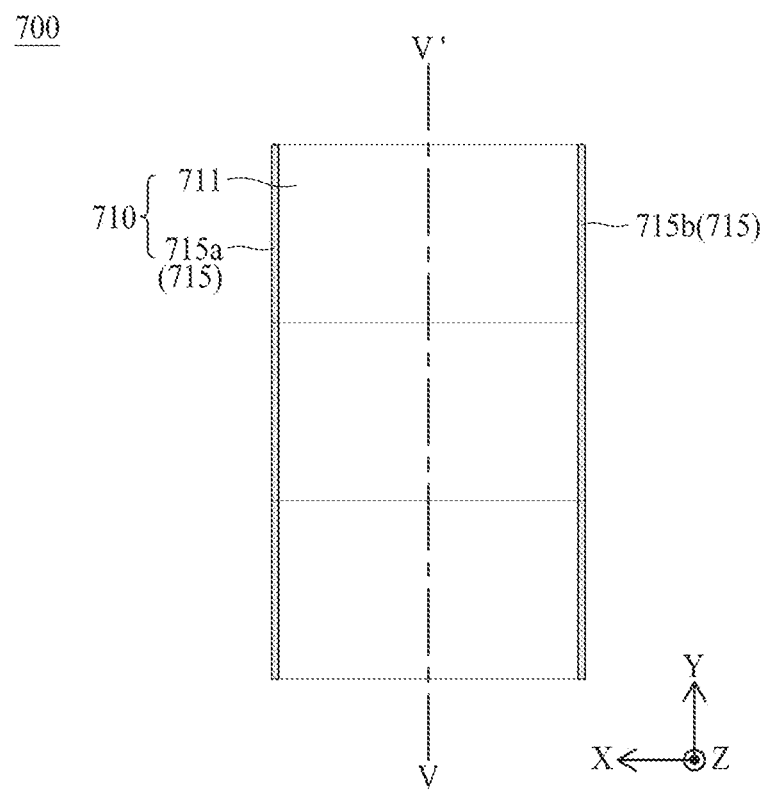
FIG. 14 is a plane view illustrating a multi-screen display apparatus according to one or more embodiments of the present disclosure.
Figure 15:
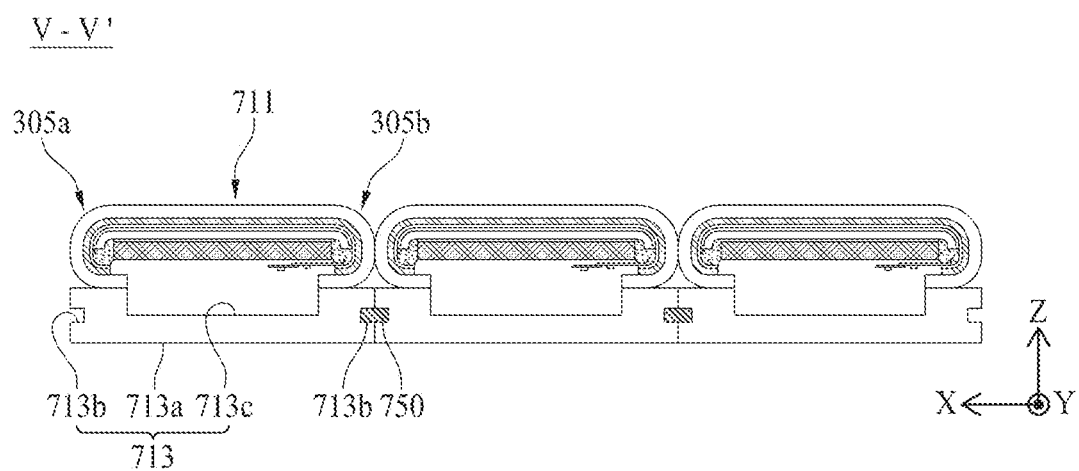
FIG. 15 is a cross sectional view along the line V-V' of FIG. 14.

FIG. 14 is a plane view illustrating a multi-screen display apparatus according to one embodiment of the present disclosure, and FIG. 15 is a cross sectional view along V-V' of FIG. 14, which show the multi-screen display apparatus using the display apparatus having the two-side (lower and upper sides) bending structure shown in FIG. 6.

Referring to FIGS. 14 and 15, a multi-screen display apparatus 700 according to one embodiment of the present disclosure includes a plurality of screen modules 710 which are closely contacted to each other while being parallel to each other.

Each of the plurality of screen modules 710 includes a display apparatus 711 and a support frame 713.

The display apparatus 711 includes a bending portion having first and second bending areas 305a and 305b which are parallel to each other. The display apparatus 711 is identical in structure to the display apparatus 100 shown in FIGS. 4 to 6, whereby a detailed description for the display apparatus 711 will be omitted.

The support frame 713 receives the display apparatus 711 therein. The support frame 713 according to one embodiment of the present disclosure includes a bottom surface 713a for supporting a rear surface of the display apparatus 711, a sidewall which is vertically prepared on the bottom surface 713a so as to surround the remaining lateral sides except the first and second bending areas 305a and 305b of the display apparatus 711, and at least one module connection portion 713b prepared in each of left and right lateral sides of the bottom surface 713a.

The bottom surface 713a may include a hollow portion 713c. The hollow portion 713c is provided while being hollowed from the bottom surface 713a, wherein the hollow portion 713c receives various circuits connected with a display driving circuit portion of the display apparatus 711.

The at least one module connection portion 713b may be connected with a module connection member 750 for closely connecting the plurality of screen modules 710 to each other. The at least one module connection portion 713b according to one embodiment of the present disclosure includes a groove having a predetermined depth from each of the left and right sides of the bottom surface 713a. In this case, the module connection member 750 may be a connection pin which is inserted into the module connection portion 713b.

Each of the plurality of screen modules 710 may further include a front cover 715.

The front cover 715 covers the remaining non-active area except the first and second bending areas 305a and 305b of the display apparatus 711. The front cover 715 according to one embodiment of the present disclosure includes a first front cover 715a and a second front cover 715b.

The first front cover 715a is formed to have "⌐" shaped cross section and is connected with the support frame 713, to thereby cover the first non-active area of the display apparatus 711.

The second front cover 715b is formed to have "ㄱ" shaped cross section and is connected with the support frame 713, to thereby cover the second non-active area of the display apparatus 711.

Herein, respective lateral sides of the plurality of screen modules 710 are connected with each other in a second direction (Y, or vertical direction) through the use of module connection member 750. In this case, the bending portions (or edge display area) of the curved shape prepared in the adjacent display apparatuses 711 are in contact with each other without being covered by the sidewall of the support frame 713 so that it is possible to virtually remove a boundary portion corresponding to a seam between the adjacent display apparatuses 711.

In case of the multi-screen display apparatus according to the embodiment of the present disclosure, the bending portions of the curved shape prepared in the plurality of display apparatuses 711 are in contact with each other, and the respective lateral sides of the plurality of screen modules 710 are connected with each other so that it is possible to virtually remove the boundary portion between the adjacent display apparatuses 711. Thus, one image may be displayed without any disconnection in an entire screen, which enables to improve a sense of immersion for an image displayed on a large-sized screen, and to improve a size expandability.

Figure 16:
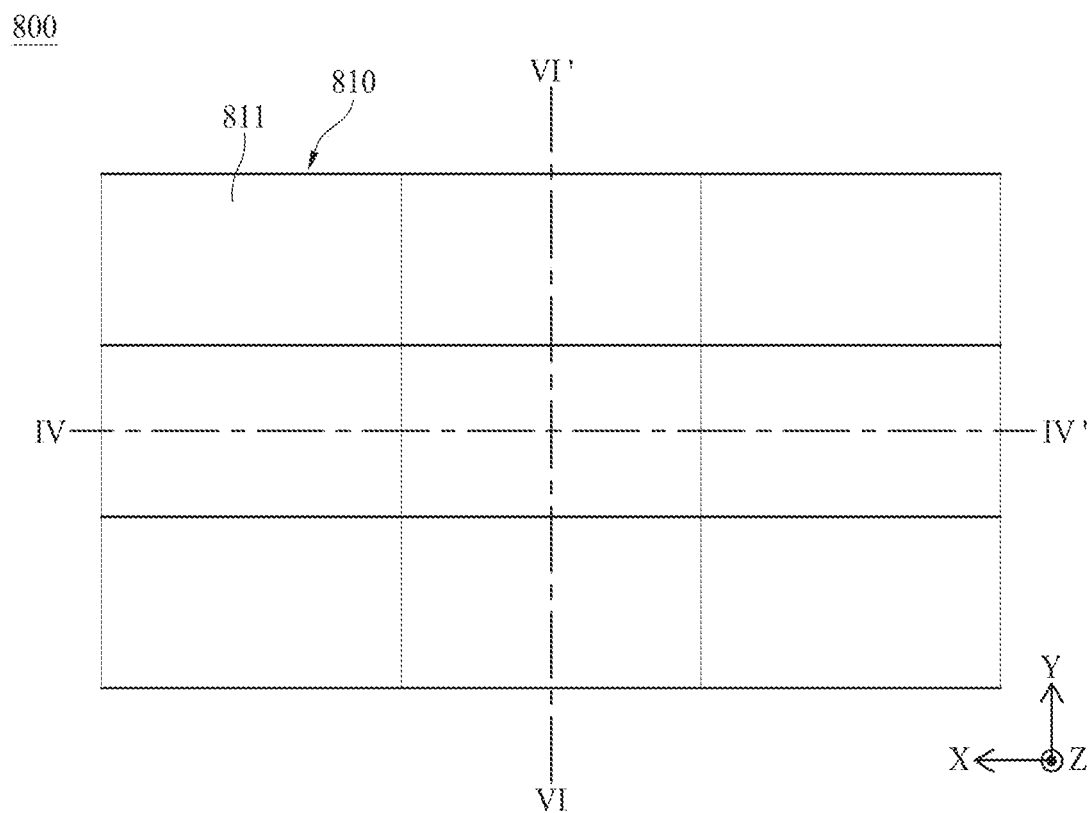
FIG. 16 is a plane view illustrating a multi-screen display apparatus according to one or more embodiments of the present disclosure.
Figure 17:
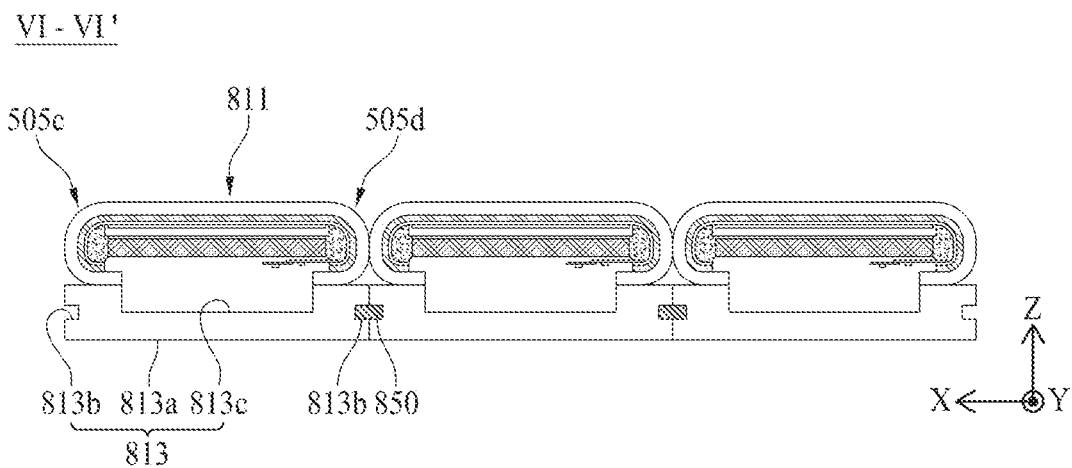
FIG. 17 is a cross sectional view along the line VI-VI' of FIG. 16.

FIG. 16 is a plane view illustrating a multi-screen display apparatus according to one embodiment of the present disclosure, and FIG. 17 is a cross sectional view along VI-VI' of FIG. 16, which show the multi-screen display apparatus using the display apparatus having the four-side bending structure shown in FIG. 9. The cross section along IV-IV' of FIG. 16 is shown in FIG. 13.

Referring to FIGS. 16 and 17 in connection with FIG. 13, a multi-screen display apparatus 800 according to one embodiment of the present disclosure includes a plurality of screen modules 810 which are arranged in a lattice pattern and closely contacted to each other.

Each of the plurality of screen modules 810 includes a display apparatus 811 and a support frame 813.

The display apparatus 811 includes a bending portion having first to fourth bending areas 105a, 105b, 505a and 505b. The display apparatus 811 is identical in structure to the display apparatus 500 having the four-side bending structure shown in FIGS. 7 to 9, whereby a detailed description for the display apparatus 811 will be omitted.

The support frame 813 receives the display apparatus 811 therein. The support frame 813 according to one embodiment of the present disclosure includes a bottom surface 813a for supporting a rear surface of the display apparatus 811, and at least one module connection portion 813b prepared at each lateral side of the bottom surface 813a.

The bottom surface 813a may include a hollow portion 813c. The hollow portion 813c is provided while being hollowed from the bottom surface 813a, wherein the hollow portion 813c receives various circuits connected with a display driving circuit portion of the display apparatus 811.

The at least one module connection portion 813b may be connected with a module connection member 850 for closely connecting the plurality of screen modules 810 to each other. The at least one module connection portion 813b according to one embodiment of the present disclosure includes a groove having a predetermined depth from each of the lateral sides of the bottom surface 813a. In this case, the module connection member 850 may be a connection pin which is inserted into the module connection portion 813b.

Herein, respective lateral sides of the plurality of screen modules 810 are connected with each other in a first direction (X, or horizontal direction) and a second direction (Y, or vertical direction) through the use of module connection member 850. In this case, the bending portions (or edge display area) of the curved shape prepared in the adjacent display apparatuses 811 are in contact with each other without being covered by the sidewall of the support frame 813 so that it is possible to virtually remove a boundary portion corresponding to a seam between the display apparatuses 811 adjacent to each other in the second direction (Y).

In case of the multi-screen display apparatus according to the embodiment of the present disclosure, the bending portions of the curved shape prepared in the plurality of display apparatuses 811 are in contact with each other, and the respective lateral sides of the plurality of screen modules 810 are connected with each other so that it is possible to remove the seam corresponding to the boundary portion between the display apparatuses 811 adjacent to each other in the first direction (X), and to minimize the seam corresponding to the boundary portion between the display apparatuses 811 adjacent to each other in the second direction (Y). Thus, one image may be displayed without any disconnection in an entire screen, which enables to improve a sense of immersion for an image displayed on a large-sized screen, and to improve a size expandability.

Accordingly, the display apparatus according to the present disclosure facilitates the bending of the bending portion, enables to have the bezel width of 10 μm or less than 10 μm in accordance with the bending of the bending portion, prevents the thin film transistor and/or emission device layer formed on the bending portion from being damaged for the process of bending the bending portion, and realizes the improved lateral-side moisture permeating prevention properties.

In case of the multi-screen display apparatus according to the embodiment of the present disclosure, one image may be displayed without any disconnection in the entire screen, which enables to improve a sense of immersion for an image displayed on a large-sized screen, and to improve a size expandability.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:
1. A display apparatus, comprising:
a first substrate having an active area, a non-active area surrounding the active area, and a bending portion having a curved shape;
a display portion disposed on the active area of the first substrate;
a protection layer covering the display portion; and a second substrate disposed on the protection layer, the second substrate having a smaller size than the active area, wherein the active area includes a first active bending area at a first edge of the active area and a second active bending area at a second edge of the active area, and wherein the second substrate is overlapped with the active area except in the first and second active bending areas.

2. The display apparatus according to claim 1, wherein the second substrate includes a first surface which is adjacent to the protection layer, and a second surface which is opposite to the first surface, and the bending portion of the first substrate is bent toward the second surface of the second substrate and surrounds a lateral side of the second substrate.

3. The display apparatus according to claim 2, further comprising a fixing member disposed between the lateral side of the second substrate and the bending portion of the first substrate.

4. The display apparatus according to claim 3, wherein the fixing member includes a moisture absorbing material.

5. The display apparatus according to claim 2, further comprising a transmissive film attached to the first substrate and overlapped with the bending portion and the active area of the first substrate.

6. The display apparatus according to claim 5, wherein the transmissive film includes:
a first area which is overlapped with the active area of the first substrate;
a second area which extends from the first area and is overlapped with the bending portion of the first substrate; and
a third area which extends from the second area and faces the second surface of the second substrate.

7. The display apparatus according to claim 2, wherein the bending portion includes:
a first bending area which is overlapped with a first non-active region of the non-active area; and
a second bending area which is overlapped with a second non-active region of the non-active area and is parallel to the first bending area.

8. The display apparatus according to claim 7,
wherein the first active bending area at the first edge of the active area is adjacent to the first non-active region, and the second active bending area at the second edge of the active area is adjacent to the second non-active region,
the first bending area includes the first non-active region and the first active bending area, and
the second bending area includes the second non-active region and the second active bending area.

9. The display apparatus according to claim 8, further comprising:
a pad portion in at least one of the first bending area and the second bending area; and
a display driving circuit portion connected with the pad portion.

10. The display apparatus according to claim 8, wherein the second substrate is formed of an opaque metal material.

11. The display apparatus according to claim 2, wherein the bending portion includes:
a first bending area which is overlapped with a first non-active region of the non-active area;
a second bending area which is overlapped with a second non-active region of the non-active area and is parallel to the first bending area;
a third bending area which is overlapped with a third non-active region of the non-active area; and
a fourth bending area which is overlapped with a fourth non-active region of the non-active area and is parallel to the third bending area, wherein the first substrate further includes a respective chamfer area at each of a plurality of corners of the first substrate, the chamfer areas configured to facilitate individual bending of each of the first to fourth bending areas.

12. The display apparatus according to claim 11,
wherein the first active bending area at the first edge of the active area is adjacent to the first non-active region, and the second active bending area at the second edge of the active area is adjacent to the second non-active region,
the first bending area includes the first non-active region and the first active bending area, and
the second bending area includes the second non-active region and the second active bending area.

13. The display apparatus according to claim 12, further comprising:
a pad portion in at least one of the third bending area and the fourth bending area; and
a display driving circuit portion connected with the pad portion.

14. The display apparatus according to claim 12, wherein the second substrate is formed of an opaque metal material.

15. The display apparatus according to claim 12, further comprising:
a transmissive film attached to the first substrate and overlapped with the bending portion and the active area of the first substrate,
wherein the transmissive film includes a respective chamfer area at each of a plurality of corners, the chamfer areas of the transmissive film being overlapped with the chamfer areas of the first substrate.

16. The display apparatus according to claim 15,
wherein the transmissive film includes:
a first area which is overlapped with the active area of the first substrate;
a second area which extends from the first area and is overlapped with the bending portion of the first substrate; and
a third area which extends from the second area and is disposed on the second surface of the second substrate.

17. A multi-screen display apparatus comprising a plurality of screen modules disposed in parallel to each other, adjacent ones of the screen modules being in contact with one another, each of the plurality of screen modules having a display apparatus including:
a first substrate having an active area, a non-active area surrounding the active area, and a bending portion having a curved shape;
a display portion disposed on the active area of the first substrate;
a protection layer covering the display portion; and
a second substrate disposed on the protection layer, the second substrate having a smaller size than the active area,
wherein bending portions of adjacent display apparatuses are in contact with each other
wherein the active area includes a first active bending area at a first edge of the active area and a second active bending area at a second edge of the active area, and
wherein the second substrate is overlapped with the active area except in the first and second active bending areas.

18. The multi-screen display apparatus according to claim 17, wherein the second substrate of each display apparatus includes a first surface which is adjacent to the protection layer, and a second surface which is opposite to the first surface, and the bending portion of the first substrate is bent toward the second surface of the second substrate and surrounds a lateral side of the second substrate.

19. The multi-screen display apparatus according to claim 18, wherein each of the display apparatuses further includes a fixing member disposed between the lateral side of the second substrate and the bending portion of the first substrate.

20. The multi-screen display apparatus according to claim 17, wherein each of the display apparatuses further includes a transmissive film attached to the first substrate and overlapped with the bending portion and the active area of the first substrate.

* * * * *